Oct. 6, 1970 I. M. PEARSON ET AL 3,532,540
DIFFERENTIAL ADHESION PROCESS FOR MAKING HIGH
RESOLUTION THIN FILM PATTERNS
Filed Oct. 26, 1967

INVENTORS
IRVING M. PEARSON
MILIVOJ ORLOVIC
JOHN L. JANNING

BY Louis A Kline
John J. Matlago
THEIR ATTORNEYS

United States Patent Office 3,532,540
Patented Oct. 6, 1970

3,532,540

DIFFERENTIAL ADHESION PROCESS FOR MAKING HIGH RESOLUTION THIN FILM PATTERNS

Irving M. Pearson, Torrance, and Milivoj Orlovic, Redondo Beach, Calif., and John L. Janning, Dayton, Ohio, assignors to The National Cash Register Company, Dayton, Ohio, a corporation of Maryland Filed Oct. 26, 1967, Ser. No. 678,328
Int. Cl. G03c *1/68;* B44d *1/10*
U.S. Cl. 117—212 18 Claims

ABSTRACT OF THE DISCLOSURE

A method of forming a high resolution thin film metal, dielectric or semiconductive pattern on a substrate which takes advantage of the relatively greater adhesion of such metals, dielectrics and semiconductors to the substrate, as compared to the adhesion to the substrate of photochromic material of a spiropyran configuration. The method involves coating the substrate with a layer of the photochromic material, forming a desired image pattern thereon using ultraviolet light, removing either the exposed or the unexposed photochromic portions with a suitable solvent to form a photochromic pattern on the substrate, and then overlaying the photochromic pattern and substrate with the metal, dielectric or semiconductive thin film of which the resultant pattern is to be formed. Pressure-sensitive adhesive tape is next applied over the metal, dielectric or semiconductive thin film. and then removed, with the result that the differential adhesion causes the portions of the metal, dielectric or semiconductive thin film in contact with the photochromic material to be removed with the adhesive tape, while portions in contact with the substrate remain to form the desired high resolution thin film pattern on the substrate.

Figure 1:
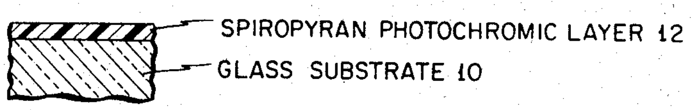

The present invention is generally directed to improved and more economical techniques for making high resolution metal, dielectric or semiconductive thin film patterns, such as may be used in micro-circuits and integrated circuits. Such thin film patterns may be made using photoengraving techniques generally similar to those used for making printed circuits, such as, for example, chemical etching of a photo-resist pattern. However, because much smaller patterns are required with greatly increased resolutions, such techniques have not always been satisfactory, and even when satisfactory, have been expensive and critical.

An important step forward towards the solution of this problem is disclosed in the commonly assigned copending patent application of Peter L. Foris, Ser. No. 338,135 filed Jan. 16, 1964 now U.S. Pat. No. 3,346,-385. This application discloses how photochromic materials of a spiropyran configuration may be differentially processed to form high resolution thin film photochromic patterns that can be used in place of conventional photoresists, such as provided by Eastman Kodak, in a chemical etching photo-engraving process to produce high resolution, thin film patterns.

The present invention provides a further step forward based on the discovery that a high resolution metal, dielectric or semiconductive thin film pattern can be formed by taking advantage of the relatively greater adhesion of such materials to an appropriate substrate, as compared to the adhesion of photochromic material of a spiropyran configuration.

In accordance with the present invention, and using the techniques diclosed in the aforementioned patent a high resolution photochromic pattern is formed on an appropriate substrate (e.g., glass) chosen so as to provide approprate differential adhesion characteristics with respect to the photochromic material and the material of which the resultant pattern is to be formed. This photochromic pattern is not used as a resist in an etching process, as disclosed in the aforementioned patent. Instead, the photochromic pattern and substrate are overlaid with the metal, dielectric or semiconductive thin film which is to form the resultant pattern, followed by the application thereto of pressure-sensitive adhesive tape or some other form of a backing provided with an adhesive surface. Removal of the pressure-sensitive adhesive tape then produces the desired high resolution thin film pattern as a result of those portions of the overlaid metal, dielectric or semiconductive thin film in contact with the photochromic material being pulled off with the adhesive tape, while those portions in contact with the substrate remain to form the resultant thin film pattern. What is particularly remarkable and unexpected about the process of the present invention is that this relatively less critical way of forming the resultant thin film pattern, involving application and removal of the pressure-sensitive adhesive tape, permits achieving a very high resolution of the order obtained using the much more critical etching techniques disclosed in the aforementioned patent. Moreover, it has been found that the substitution of conventional photo-resist materials in place of the photochromic material in the above described method, using the pressure-sensitive adhesive tape, did not give satisfactory results.

The specific nature of the invention as well as other objects, advantages and uses thereof will become evident from the following description taken in conjunction with the accompanying drawings in which FIGS. 1–6 are cross-sectional views illustrating typical steps in the formation of a high resolution metal, dielectric or semiconductive thin film pattern in accordance with the invention.

Figure 2:
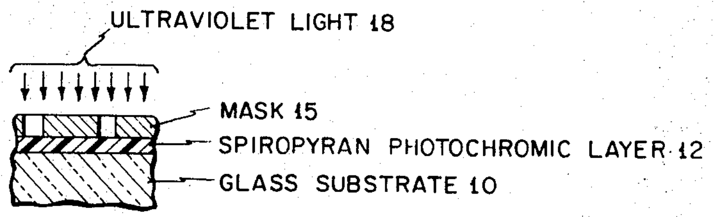
Figure 3:
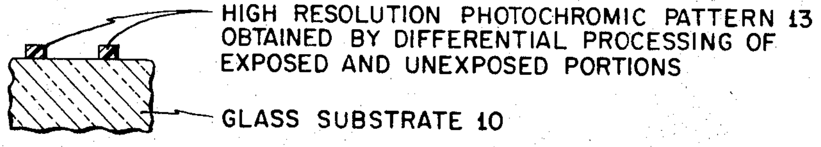

FIG. 1 illustrates a glass substrate 10 having a spiropyran photochromic layer 12 provided thereon in a manner to be described in detail later on herein. In FIG. 2, a high resolution image is contact printed on the photochromic layer 12 by applying ultraviolet light 18 thereto through a high resolution mask 15 having the desired pattern thereon. Laser recording using the teachings of the commonly assigned copending patent application Ser. No. 549,281, filed May 11, 1966 now U.S. Pat. No. 3,465,-352, may also be used to form the desired image on the photochromic layer 12. Using the teachings of the aforementioned patent Ser. No. 338,135 and now U.S. Pat. No. 3,346,385, the photochromic layer 12 is then differentially processed based on the different solubility characteristics between exposed and unexposed portions to form the resultant high resolution photochromic pattern 13 shown in FIG. 3.

Figure 4:
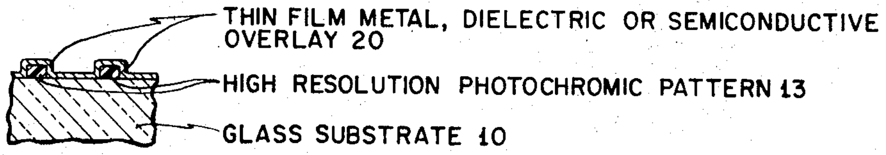
Figure 5:
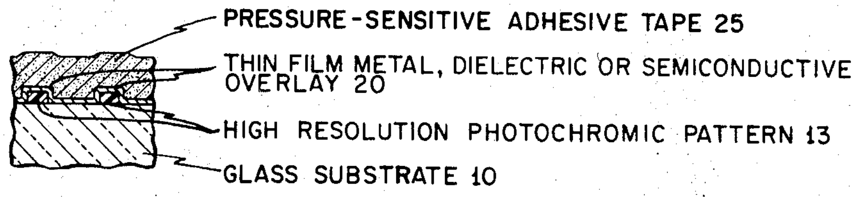
Figure 6:
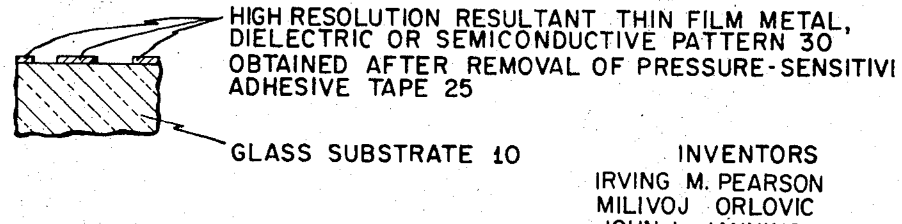

Next, as illustrated in FIG. 4, this high resolution photochromic pattern 13 is provided with a thin film overlay 20 of the metal, dielectric or semiconductive material which is to constitute the resultant pattern. As shown in FIG. 5, pressure-sensitive adhesive tape 25 is then applied over the thin film overlay 20. When the pressure-sensitive adhesive tape 25 is removed, those portions of the thin film overlay 20 in contact with the photochromic pattern 13 will be pulled off therewith, while those portions in contact with the substrate 10 remain to form the desired high resolution thin film pattern 30, as illustrated in FIG. 6.

Photochromic material, as referred to herein, is a spirocarbon-containing organic compound material, involving one or a mixture of similar or dissimilar compounds, that respond in amorphous solid state to ultraviolet light by exhibiting a change of molecular configuration subject to inherent thermal reversal due to environmental temperature. These photochromic materials, alone or in combination, can be made to form very thin, continuous amorphous layers on a substrate by deposit from a solution of photochromic material in a readily evaporable solvent, or by deposit and condensation of a vapor form of the photochromic material onto the substrate. As disclosed in detail in the aforementioned patent, when such a photochromic layer has an ultraviolet image pattern applied thereto, not only is a color change produced in accordance with the image pattern, but also exposed and unexposed portions of the photochromic layer are rendered differentially soluble areawise in accordance with the image pattern, whereby to permit the photochromic layer to be appropriately processed to produce a photochromic pattern on the substrate in accordance with the desired image pattern. Because a photochromic layer of this type can be made without optical graininess, a very high resolution image pattern can be formed thereon, which in turn makes possible the obtaining of a very high resolution photochromic pattern after differential processing.

The present invention starts with the formation of a high resolution photochromic pattern on an appropriate substrate using the techniques of the aforementioned patent. However, in the present invention, the photochromic material and substrate are chosen with the aim of optimizing the differential adhesion between the photochromic material and the material of which the resultant pattern is to be formed with respect to the substrate.

For the preferred embodiment and other embodiments disclosed herein, glass is used as the substrate, since it has been found to exhibit the differential adhesion properties required for the present invention. The term "glass" includes glass-like materials of homogeneous or composite nature, such as glazed ceramics as well as other materials providing a rigid, stable non-porous substrate surface similar to that provided by glass.

In general, the spiropyran photochromic materials useable in the present invention may be the same as those disclosed in the aforementioned patent. More specifically, it has been found that the thin layers of photochromic compound material may be deposited on the selected substrate by applying a comparably thin liquid solution thereof, in a readily evaporable solvent, to the receiving surface of the substrate and allowing the solvent to evaporate. The solvent may be a readily-evaporable non-polar hydrocarbon liquid if the photochromic material is in the non-polar state, or a polar solvent if the material is in a polar state. Certain well-known photochromic compounds which are derived from the condensation of substituted Fischer's base with substituted salicylaldehyde will dry from readily evaporable hydrocarbon solvent solutions into amorphous layers, either alone or in combination, and are stable in continuous solid amorphous state form for some hours at room temperature.

If the selected dye does not "want" to form an amorphous continuous layer alone, as would be indicated by a cloudiness of the dried solid deposit, an additive may be added to the solution in the nature of a closely related derivative that has the same photochromic properties but which inhibits the crystalline alinement of the deposited molecules. For instance, if the well-known photochromic material made by condensing Fischer's base with salicylaldehyde substitute so as to form

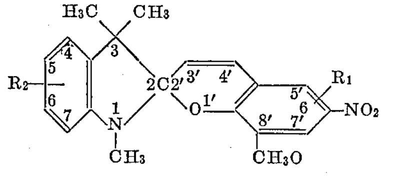

will not yield an amorphous deposit from solution as determined by the cloudiness test, owing to the extreme purity of the compound or its aging behavior, then there may be added thereto in solution an amount of the 5'Br, $6'NO_2$, $8'CH_3O$ derivative sufficient to form a molecular mixture that forms a continuous non-crystalline layer without interfering with the photochromic and solubility characteristics associated with each individually. Indeed, even a slightly impure condensation product may work to produce a better amorphous film from solution than a completely purified homogeneous product, as is well-known to those skilled in the art attempting to prepare purely crystalline organic compounds. Some of the purified compounds readily form an amorphous deposit layer without addition materials but resort to addition agents may be required if there is a tendency to crystallize immediately or over a certain period of time it is desired to keep the coated substrate in condition for use to form resist images with ultraviolet radiation.

A large number of these Fischer's base/salicylaldehyde condensation compounds are described in British Pat. 887,958 (1960), in U.S. Pat. No. 3,100,778 which issued Aug. 13, 1963, and in U.S. Pat. 2,953,454, which issued in September 1960 on the application of Elliot Berman.

It has been found that among these compounds are those that alone will form amorphous solid layers from the evaporation of the solvent from thin liquid solution layers, specifically the following derivatives where $R_1$ and $R_2$ if not substituted are deemed to be hydrogen.

(I) $R_1$=6'$NO_2$, 8'$OCH_3$
(II) $R_1$=5'Br, 6'$NO_2$, 8'$OCH_3$
(III) $R_1$=6'$NO_2$, $R_2$=5$CH_2CH_2OH$
(IV) $R_1$=6'$NO_2$, 8'$OCH_3$; $R_2$=5$CH_2CH_2OH$
(V) $R_1$=5'Br, 6'$NO_2$, 8'$OCH_3$; $R_2$=5$CH_2CH_2OH$
(VI) $R_1$=5'Br, 6'$NO_2$, 8'$OCH_3$; $R_2$=7 phenyl These compounds, even though alone producing amorphous layers from solution may be used in combination to improve the stability of them against crystal growth—the steric differences of the molecules supposedly inhibiting crystal formation, as do the residual impurities of manufacture if not completely eliminated.

Also useful photochromic materials are the naphthobenzo derivatives of the named nucleus, such as

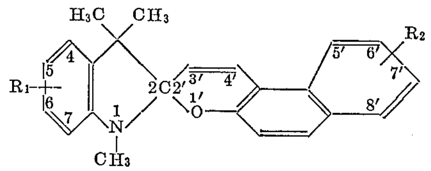

especially where $R_1$=4,7 dimethoxy; or $R_2$=7'$NO_2$.

All of the named derivative compounds act singly to produce amorphous layers. Other derivatives in combination also are eligible as all are photochromic and a change in solubility is inherent in their change from the non-polar state to the polar state through the making and breaking of 2'-spiro-carbon to oxygen bond. The performance of the amorphous layers of these compounds in the differential adhesion process of the present invention will vary, and the variations themselves will spell-out to those skilled in the art their conditions of use with regard to associated substrates and the metals, dielectrics or semiconductors of which the resultant thin film pattern is to be formed.

Generally, the uncolored compounds which have not been switched to the colored state are more soluble in non-polar hydrocarbon solvents than the same compounds in the colored state. This allows the uncolored portions of the photochromic layers to be washed away or extracted by the non-polar solvents without affecting the colored areas, except as next explained. Because, in an area exposed to ultraviolet light the molecules of the photochromic material are switched molecule-by-molecule, according to the incident applied energy, a given area that is held to be in a colored condition, is not wholly so as there remain uncolored molecules. Such mixture of molecules in both configuration states is not incompatible with stability of the colored molceules, but such stability is enhanced by the extraction of the non-polar molecules from amongst the colored polar molecules by the same non-polar solvent used to extract or wash off the background area. Because there is no binder material present, the image area after being extracted of the non-polar molecules is more stable thermally than before.

Generally, the solvents that will distinguish between the non-polar colorless form of the photochromic material and the polar colored form thereof are the saturated hydrocarbon aliphatic and alicyclic liquids such as hexane, heptane, octane, cyclohexane, and methyl cyclohexane, and also petroleum ethers of 30°–60° centigrade boiling point range, among others. These solvents will dissolve the non-polar spiro-pyrans of the reaction of substituted Fischer's base with substituted salicylaldehydes, as disclosed, but not the polar colored forms thereof. The same photochromic materials in the colored and uncolored states cannot be distinguished by polar solvent liquids such as benzene, toluene acetone, methyl ethyl ketone and other ketonic solvents, ester solvents and alcohols.

If the molecules in the colored state are treated with hydrochloric acid vapors they will be converted from a normal blue color to a yellow color associated with the acid complex thereof, in which acid-complex state they will resist aromatic hydrocarbon solvents. Hence, the image forming molecules that have been colored can sense the difference not only between polar and non-polar hydrocarbon solvents, but between aromatic and non-aromatic polar solvents. This yellow condition may be reversed by after-treatment with ammonia vapor. This secondary yellow condition may be used as a substrate for a new amorphous layer of photochromic material if desired, or may be used for a more insoluble resist to certain etching solutions in a manner to be described.

The halogen acid complex of the unexposed photochromic layer is light yellow and photosensitive and yields on exposure to ultraviolet light a deep yellow form identical with the complex formed by treating the exposed colored form of the amorphous layer with halogen acid fumes.

Aliphatic and alicyclic hydrocarbon solvents will not distinguish the hydrochloric acid complexes of these compounds in the colored and uncolored state, being insoluble therein.

Dilute aqueous acidic solutions will wash off the colored forms of these compounds. Of the hydrochloric acid-converted photochromic materials, the exposed colored portions may be washed off with water leaving unexposed molecules.

The metal, dielectric or semiconductive thin film overlay 20 may be formed using well known deposition techniques. The important characteristic of such thin films for the purposes of the present invention is that they adhere well to the substrate. The term "metal" includes in scope alloys, mixtures and fabrications containing metal ions, atoms, or molecules, preferred metals being chromium, tantalum, nickel, cobalt and Permalloy. Multiple metal layers may also be used as the thin film overlay 20. For example, gold could be used over an underlying metal layer for protection thereof during special processing, or Permalloy could be used over tantalum if a magnetic resultant pattern is desired. Dielectrics for the overlay 20, such as silicon monoxide, have been found successful, while germanium has proved successful for use as semiconductive thin film overlay. Other suitable materials for the thin film overlay 20 are the compound semiconductor cadmium selenide (CdSe), and the metals aluminum, tin and titanium.

EXAMPLE I

A typical and preferred embodiment of the invention will now be described with reference to the drawing. On the support plate formed of a glass substrate 10 or other rigid, non-porous substance is placed a thin layer 12 of a 10% liquid filtered solution of photochromic material in benzene, the photochromic material being selected from the previously listed compounds I to VI alone or in any combination in any proportions. The thin layer 12 of photochromic material is applied to the surface of the glass substrate 10 after the latter has been cleaned so that a good wetting thereof occurs. The amount of liquid solution supplied is gauged by the thickness of the amorphous solid layer desired or required. In general, a thin submicron layer, in dried state, is desirable for fine resolution. The concentration of photochromic material in solution may be reduced or increased to bring about a desired change in thickness, but a 1% to 10% concentration seems to work best. The liquid layer 12 is dried preferably at room temperature in air, but other conditions of drying to prevent crystallization of the dried layer may be used as the occasion warrants.

Next, the image pattern is formed by application of ultraviolet light 18 of a wave-length of 375–400 millimicrons, by use of an optical light mask (stencil) 15, or by projection of a stationary or moving beam of light thereon, or by such means acting together. The plate now is washed with a non-polar solvent such as petroleum ether (e.g., 30–60° C. boiling fraction) or methylcyclohexane, which removes the unexposed photochromic material and leaves the image pattern 13 in colored form.

The plate is then placed in a vacuum apparatus and glow discharge cleaning is carried out for approximately one minute at $10^{-1}$–$10^{-2}$ torr. The pressure is then reduced to $10^{-5}$ torr and argon is introduced to a pressure of $1.5 \times 10^{-3}$ torr. A thin, approximately 1000 angstroms, layer of a metal overlay 20 such as tantalum or chromium, which adheres well to glass, is sputtered (direct current) over the photochromic pattern 13. The rate of sputtering and temperature of the cathode are controlled to avoid overheating of the image patttrn of photochromic. The sputtering is carried out for approximately 2 minutes at 40 milliamps and 4300 volts. Thicker, or thinner, films of the metal overlay 20 may be sputtered over the photochromic image pattern. In general, thinner films are desirable for high resolution.

The plate may be removed from the vacuum apparatus at this point. Pressure-sensitive adhesive tape 25, with an adhesion of as much as 80 (measured as force in ounces required to pull a 1-inch wide strip of tape from a steel surface) is applied firmly to the metal overlying the photochromic pattern 13. The tape 25 is then pulled off smoothly. The metal overlay 20 overlying the (exposed) photochromic material is removed by the tape 25; the metal overlay in contact with the glass substrate 10 remains and forms a metal pattern 30 which may be used as a conductor, a dielectric if oxidation is now carried out for tantalum, a photographic mask, or for decorative purposes.

EXAMPLE II

In this example the same photochromic and other materials are employed as in Example I but laser recording is used in place of a mask 15 or projection by light. The photochromic layer 12 should be preferably exposed first with ultraviolet, and the laser should emit at a wave length, e.g. 6328 angstroms, at which the colored photochromic layer absorbs strongly. The imaged photochromic material is washed with petroleum ether or methylcyclohexane having a 30°–60° C. boiling point range before carrying out the glow dischange treatment as described in Example I.

EXAMPLE III

In this example, the same photochromic materials are employed as in Example I, but a multiple metal layer is used in place of a single metal overlay. In one application of the multiple layer process, gold is sputtered over an underlaying metal layer of chromium or tantalum layer over the photochromic image pattern. The metal layers overlying the photochromic material are then removed with tape 25 in the usual way. The glass substrate 10 now exposed by removal of photochromic and metal materials can now be etched and even pierced with strong hydrofluoric acid or hydrofluoric-nitric acid mixtures while the gold overlay affords protection to the metallized areas against the acid attack. Conductive wires can now be inserted through holes provided in the glass substrate and placed in contact with the metal pattern for some circuit applications. In another application of the multiple layer process, a metal layer of permalloy is sputtered over an underlayer of chromium or tantalum and the metallized pattern 30 is then formed as before. This pattern is particularly useful if a strongly adherent, magnetic pattern is sought.

EXAMPLE IV

In this example the same photochromic materials are employed as in Example I, but the semiconductor (nonmetal) germanium, is evaporated over the photochromic image pattern to form the overlay 20 in place of a metal. A semiconductor pattern 30, useful in circuitry, can now be formed after application of the tape 25 as before.

It is to be understood that the embodiments and examples disclosed herein are only exemplary and should not be deemed as restricting the invention. The present invention should be useful wherever the desired differential adhesion is obtainable between a high resolution working pattern 13 and a thin film overlay 20 with respect to the substrate 10. For example, although Fischer's base/salcylaldehyde condensation products of photochromic characteristics have been specified as fulfilling the purposes of the invention, other similar compounds to the benzoindolinospiropyrans should also be useful, particularly those in which the 3-carbon atom is replaced with O or S.

Accordingly, the present invention should be considered as including all possible embodiments and modifications and variations thereof falling within the scope of the appended claims.

What is claimed is:

1. A process for making high resolution thin film patterns including the steps of: forming a high resolution working pattern on a substrate, overlaying the working pattern and substrate with a thin film of the material which is to form the resultant pattern, applying a backing having a pressure-sensitive adhesive surface over the overlaid thin film, and then removing the backing, the working pattern and the thin film overlaying said working pattern, the materials forming said thin film and said working pattern being chosen in conjunction with the substrate so that there is sufficient differential adhesion therebetween to cause those portions of the thin film overlay in contact with the working pattern to be removed with the adhesive surface of said backing while those portions of the thin film overlay in contact with the substrate remain to form the desired high resolution thin film pattern on the substrate.

2. A process for making high resolution thin film patterns including the steps of: forming a high resolution working pattern on a substrate, overlaying the working pattern and substrate with a thin film of the material which is to form the resultant pattern, applying pressure-sensitive adhesive tape over the overlaid thin film, and then removing the pressure-sensitive adhesive tape, the material forming the working pattern and the thin film being chosen in conjunction with the substrate so that there is sufficient differential adhesion therebetween to cause those portions of the thin film overlay in contact with the working pattern to be removed with the pressure-sensitive adhesive tape, while those portions of the thin film overlay in contact with the substrate remain to form the desired high resolution thin film pattern on the substrate.

3. A process for making high resolution thin film patterns including the steps of: providing a photochromic layer on a substrate, forming a high resolution image on the photochromic layer, differentially processing the photochromic layer to form a high resolution photochromic pattern, overlaying the photochromic pattern and substrate with a thin film of the material which is to form the resultant pattern, applying pressure-sensitive adhesive tape over the overlaid thin film, and then removing the pressure-sensitive adhesive tape, the materials forming the photochromic layer and the thin film being chosen in conjunction with the substrate so that there is sufficient differential adhesion therebetween to cause those portions of the thin film overlay in contact with the photochromic pattern to be removed with the pressure-sensitive adhesive tape, while those portions of the thin film overlay in contact with the substrate remain to form the desired high resolution thin film pattern on the substrate.

4. The invention in accordance with claim 3 wherein said thin film overlay which is to form the resultant pattern is applied onto the photochromic pattern and substrate by sputtering.

5. A process for making high resolution thin film patterns including the steps of: providing an amorphous layer of photochromic material of a spiropyran configuration on a substrate, forming a high resolution image on the photochromic layer by application of light, differentially processing the photochromic layer to form a high resolution photochromic pattern, overlaying said photochromic pattern with a thin film selected from the group consisting of metals, dielectrics and semiconductors, applying pressure-sensitive tape over the overlaid thin film, and removing the pressure-sensitive tape, the materials of the photochromic pattern, the thin film and the substrate being chosen so that there is sufficient differential adhesion therebetween to cause those portions of the thin film overlay in contact with said photochromic pattern to be removed with the pressure-sensitive tape, while those portions of the thin film overlay in contact with the substrate remain to form said high resolution thin film pattern on the substrate.

6. In the process of claim 5, in molecules of said photochromic material being converted from a normal state in which they are readily soluble in non-polar hydrocarbon solvents to a state where they are not soluble in said non-polar hydrocarbon solvent by absorption of light.

7. The process of claim 5 in which sadi substrate is selected from the group consisting of glass and glass-like material.

8. The process of claim 5 in which said thin film overlying said photochromic layer is deposited by sputtering.

9. The product of the process of claim 5.

10. A process for forming a high resolution thin film pattern including the steps of: forming a substantially amorphous solid film of photochromic material of a spiropyran configuration on a substrate by molecular deposition, forming a pattern on the photochromic material by applying ultraviolet light thereto, washing the photochromic material with a non-polar solvent to wash away the unexposed areas of the photochromic material to expose the substrate in said unexposed areas, overlaying said photochromic material and exposed substrate with a thin film adhering to said photochromic material and to said substrate, applying a pressure-sensitive material adapted to adhere to the overlaid thin film, and removing the pressure-sensitive material together with the thin film overlaid on the photochromic material and the photochromic material adhering thereto, leaving said thin film adhering to selected areas of the substrate.

11. In the process of claim 10 selectively irradiating said photochromic layer with a laser to define said working pattern.

12. In the process of claim 10, overlaying a first thin film of a first metal on said photochromic film and said substrate, and overlying said first thin film with a second thin film of a second metal.

13. In the process of claim 12, wherein said first metal is selected from the class consisting of chromium and tantalum.

14. In the process of claim 13, wherein said second metal is gold.

15. In the process of claim 13, wherein said second metal is permalloy.

16. The product of the process of claim 12.

17. A process for forming a high resolution thin film pattern including the steps of forming a substantially amorphous solid film of photochromic material of a spiropyran configuration on a substrate by molecular deposition, forming an image on the photochromic material by applying ultraviolet light thereto by selected areas, treating the film of photochromic material with fumes of a halogen acid to form the acid complex of the photochromic material, those areas only that were converted by light being soluble in aromatic hydrocarbon liquid solvents, washing the photochromic material with liquid hydrocarbon solvent to remove the converted image area thereof, leaving the image in terms of exposed substrate material, overlaying the remaining photochromic material and substrate with a thin film adhering to said photochromic material and said substrate, said thin film and said photochromic material differentially adhering to said substrate, applying a pressure-sensitive material adapted to adhere to the overlaid thin film, and removing the pressure-sensitive material together with the thin film overlaid on the photochromic material and the photochromic material adhering thereto, leaving said thin film adhering to selected areas of the substrate.

18. The product of the process of claim 17.

References Cited

UNITED STATES PATENTS

| | | | |
|---|---|---|---|
| 3,442,646 | 5/1969 | Anudon et al. | 96—90 X |
| 3,412,456 | 11/1968 | Ebisawa | 96—36.2 |
| 3,390,192 | 6/1968 | Hall | 96—90 X |
| 3,364,023 | 1/1968 | Becker et al. | 96—90 X |
| 3,346,385 | 10/1967 | Floris | 96—36 |
| 3,341,330 | 9/1967 | Floris | 96—90 X |
| 3,329,502 | 7/1967 | Ulman | 96—90 |
| 3,320,067 | 5/1967 | Taylor | 96—90 |
| 3,304,180 | 2/1967 | Darian | 96—90 X |
| 3,100,778 | 8/1963 | Berman | 96—90 X |
| 2,990,034 | 9/1961 | Heidenhain. | |

ALFRED L. LEAVITT, Primary Examiner

A. GRIMALD, Assistant Examiner

U.S. Cl. X.R.

96—36.2, 90; 117—85, 215